US010326069B2

(12) United States Patent
Ishida et al.

(10) Patent No.: US 10,326,069 B2
(45) Date of Patent: Jun. 18, 2019

(54) THERMOELECTRIC CONVERSION ELEMENT AND METHOD FOR MAKING THE SAME (71) Applicant: NEC Corporation, Tokyo (JP)

(72) Inventors: Masahiko Ishida, Tokyo (JP); Akihiro Kirihara, Tokyo (JP); Shigeru Koumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/762,674

(22) PCT Filed: Jan. 17, 2014

(86) PCT No.: PCT/JP2014/000212
§ 371 (c)(1),
(2) Date: Jul. 22, 2015

(87) PCT Pub. No.: WO2014/115518
PCT Pub. Date: Jul. 31, 2014

(65) Prior Publication Data
US 2015/0372213 A1 Dec. 24, 2015

(30) Foreign Application Priority Data

Jan. 24, 2013 (JP) ................................ 2013-011338

(51) Int. Cl.
*H01L 35/28* (2006.01)
*H01L 29/82* (2006.01)
(Continued)

(52) U.S. Cl.
CPC ........ *H01L 35/28* (2013.01); *H01L 29/66984* (2013.01); *H01L 29/82* (2013.01);
(Continued)

(58) Field of Classification Search
CPC ......... H01L 35/00; H01L 35/02; H01L 35/12; H01L 35/18; H01L 35/20; H01L 35/34; H01L 27/22
See application file for complete search history.

(56) References Cited

U.S. PATENT DOCUMENTS 5,376,184 A * 12/1994 Aspden ................... H01L 35/00
136/203

FOREIGN PATENT DOCUMENTS

| JP | 2009-130070 A | 6/2009 |
| JP | 2011-249746 A | 12/2011 |
| WO | WO-2013/035148 A1 | 3/2013 |

OTHER PUBLICATIONS

Electrical Conductivity of the elements retrieved from http://periodictable.com/Properties/A/ElectricalConductivity.an.wt.html on Apr. 16, 2018.*
International Search Report, Corresponding to PCT/JP2014/000212, dated Mar. 25, 2014, 1 page.
(Continued)

*Primary Examiner* — Christina Chern
(74) *Attorney, Agent, or Firm* — Wilmer Cutler Pickering Hale and Dorr LLP (57) ABSTRACT

In order to further improve the spin-current/electric-current conversion efficiency in a spin-current thermoelectric conversion element, a thermoelectric conversion element includes a magnetic material layer having in-plane magnetization; and an electromotive material layer magnetically coupled with the magnetic material layer. The electromotive material layer includes a first conductor with a spin orbit coupling arising, and a second conductor having lower electric conductivity than electric conductivity of the first conductor.

4 Claims, 7 Drawing Sheets (51) Int. Cl.
*H01L 37/00* (2006.01)
*H01L 29/66* (2006.01)
*H01L 35/04* (2006.01)
*H01L 35/34* (2006.01)
*H01L 35/20* (2006.01)
*H01L 35/22* (2006.01)
*H01L 35/26* (2006.01)

(52) U.S. Cl.
CPC .............. *H01L 35/04* (2013.01); *H01L 35/20* (2013.01); *H01L 35/22* (2013.01); *H01L 35/26* (2013.01); *H01L 35/34* (2013.01); *H01L 37/00* (2013.01)

(56) References Cited

OTHER PUBLICATIONS

Uchida et al., "Electric Detection of the Spin-Seebeck Effect in Magnetic Insulator in the Presence of Interface Barrier," Journal of Physics: Conference Series, vol. 303, Issue 1, 2011, Joint European Magnetic Symposia—JEMS2010, Jul. 6, 2011, 012096, 4 pages.

Uchida et al., "Spin Seebeck Insulator," Nature Materials, Nov. 2010, vol. 9, p. 894-897, 4 pages.

Uchida et al., "Observation of Longitudinal Spin-Seebeck Effect in Magnetic Insulators," Applied Physics Letters, 2010, vol. 97. p. 172505, 4 pages.

Uchida et al., "Enhancement of Spin-Seebeck Voltage by Spin-Hall Thermopile," Applied Physics Express, Aug. 17, 2012, vol. 5, Issue 9, pp. 093001-1-093001-3, 3 pages.

* cited by examiner

FIG. 8 under a non-magnetic metal, they are in the state of being "magnetically coupled".

THERMOELECTRIC CONVERSION ELEMENT AND METHOD FOR MAKING THE SAME

CROSS-REFERENCE TO RELATED APPLICATIONS

The present application is a national stage application of International Application No. PCT/JP2014/000212 entitled "Thermoelectric Conversion Element and Method for Making the Same," filed on Jan. 17, 2014, which claims the benefit of priority from Japanese Patent Application No. JP2013-011338, filed on Jan. 24, 2013, the disclosures of which are incorporated herein in their entirety by reference thereto. The present invention relates to a thermoelectric conversion element based on the spin Seebeck effect and the inverse spin Hall effect and a method for making the same.

TECHNICAL FIELD

Background Art

In recent years, an electronic technology called "spintronics" has been attracting lots of attention. While the conventional electronics has utilized only "electric charge" that is one property of an electron, the spintronics also utilizes actively a "spin" that is another property of an electron in addition to the electric charge. In particular, a "spin-current", that is, a flow of the spin angular momentum of an electron is an important concept. Since the spin-current has weak energy dissipation, there is a possibility of realizing highly efficient information transfer by utilizing the spin-current. Therefore, it has become an important subject to generate, detect, and control the spin-current.

For example, a phenomenon has been known that the spin-current is generated if an electric current flows. This phenomenon is called the "spin Hall effect". The reverse phenomenon has been also known that an electromotive force is generated if the spin-current flows. This is called the "inverse spin Hall effect". By utilizing the inverse spin Hall effect, it is possible to detect the spin-current. The spin Hall effect and the inverse spin Hall effect both appear significantly in substances with large "spin orbit coupling", for example, platinum (Pt) and palladium (Pd).

Recent research has also revealed that the "spin Seebeck effect" appears in magnetic materials. The spin Seebeck effect is a phenomenon that the spin-current is induced, if a temperature gradient is applied to the magnetic material, parallel to the direction of the temperature gradient (see Patent Literature 1 and Patent Literature 2, for example). That is to say, heat is converted into the spin-current (a thermal spin-current conversion) by the spin Seebeck effect. It is reported in Patent Literature 1 that the spin Seebeck effect appears in a NiFe film, which is a ferromagnetic metal. It is reported in Non Patent Literature 1 and Non Patent Literature 2 that the spin Seebeck effect appears in the interface between an electromotive material film and a magnetic insulating material such as yttrium iron garnet (YIG, $Y_3Fe_5O_{12}$).

The spin-current induced by the temperature gradient can be converted into an electric field (an electric current or an electric voltage) by using the inverse spin Hall effect mentioned above. That is to say, it becomes possible to realize "a thermoelectric conversion" of converting the temperature gradient into electricity by utilizing both the spin Seebeck effect and the inverse spin Hall effect. An exactly reverse process is also possible in which an electric current is made to flow into the same device, the electric current is converted into the spin-current by the spin Hall effect, a heat flow is generated from the spin-current by the spin Peltier effect, and a temperature gradient is generated in the device.

Figure 1:
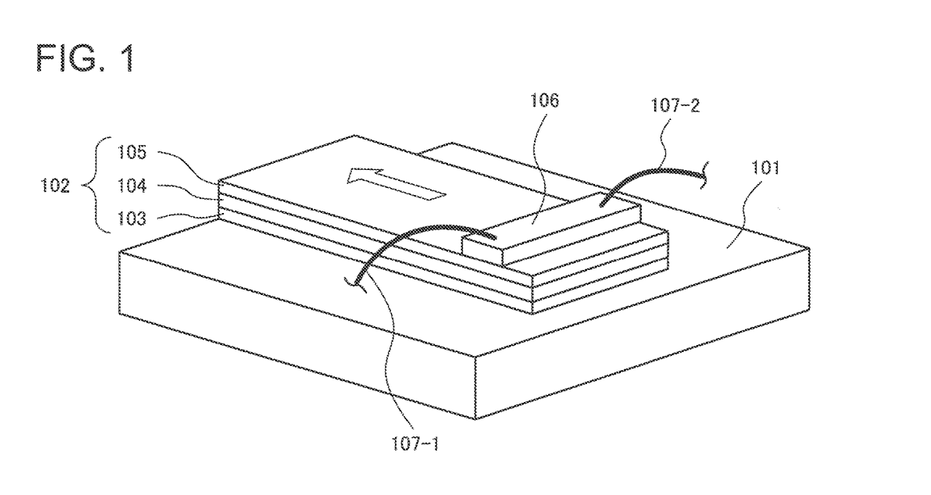
FIG. 1 is a schematic view illustrating a thermoelectric conversion element described in Patent Literature 1.

FIG. 1 illustrates the configuration of a thermoelectric conversion element using the spin Seebeck effect disclosed in the Patent Literature 1. A thermal spin-current conversion part 102 is formed on a sapphire substrate 101. The thermal spin-current conversion part 102 has a stacking structure including a Ta film 103, a PdPtMn film 104, and a NiFe film 105. The NiFe film 105 is a magnetic film magnetized in-plane direction. In addition, a Pt film 106 is formed on the NiFe film 105 as an electromotive material film, and both ends of the Pt film 106 are connected to terminals 107-1 and 107-2, respectively.

In the thermoelectric conversion element configured as described above, the NiFe film 105 plays a role in generating the spin-current from the temperature gradient by the spin Seebeck effect, and the Pt film 106 acts as spin-current/electric-current converting material to generate the electromotive force from the spin-current by the inverse spin Hall effect. Concretely, if a temperature gradient is applied in-plane direction of the NiFe film 105, the spin-current is generated in the direction parallel to the temperature gradient by the spin Seebeck effect. Then, the spin-current flows into the Pt film 106 from the NiFe film 105, or the spin-current flows out from the Pt film 106 to the NiFe film 105. In the Pt film 106, the electromotive force is generated by the inverse spin Hall effect in a direction perpendicular to the spin-current direction and the NiFe magnetization direction. The electromotive force can be taken out from the terminals 107-1 and 107-2 provided for both ends of the Pt film 106.

Figure 2:
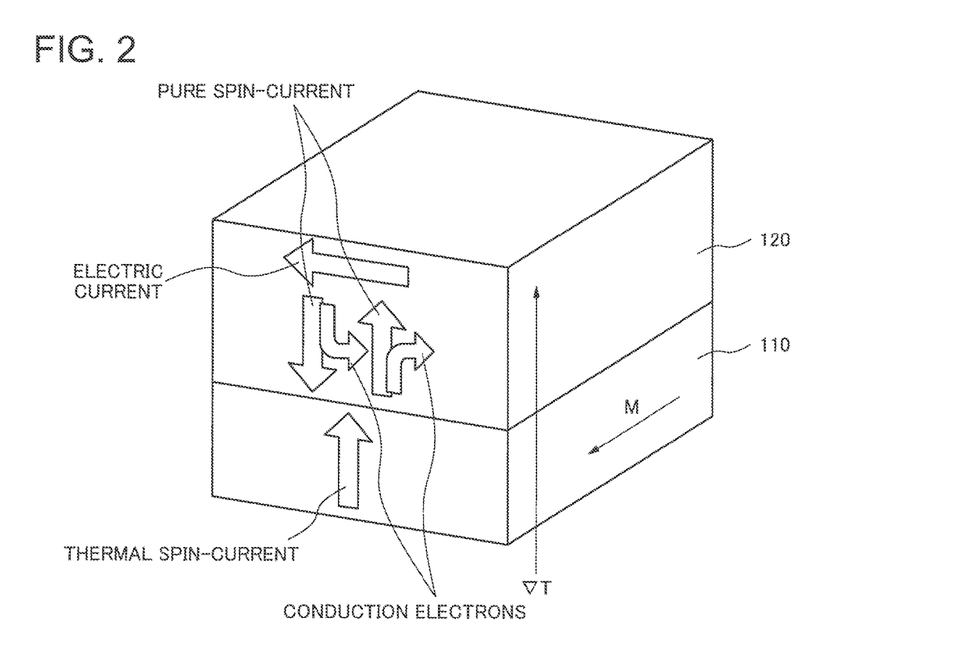
FIG. 2 is a schematic view illustrating a typical longitudinal type of thermoelectric conversion element.

FIG. 2 illustrates the configuration of a longitudinal type of thermoelectric conversion element disclosed in the Patent Literature 2. As illustrated in FIG. 2, an electromotive material layer 120 is stacked on a magnetic material layer 110. In the longitudinal type of thermoelectric conversion element, a temperature gradient VT is applied in the stacking direction.

If the temperature gradient is applied in the stacking direction, the thermal spin-current flows in the same direction, that is, from the high temperature side to the low temperature side. The thermal spin-current also generates a pure spin-current in the electromotive material film through a process called a spin injection at the interface between the magnetic material layer 110 and the electromotive material layer 120. The spin injection is a phenomenon that spins, precessing around the magnetization direction near to the interface, interact with conduction electrons without spins in the electromotive material film, and transfer or receives a spin angular momentum. As a result, "the pure spin-current" by the conduction electrons with spins is generated near to a spin injection interface in the electromotive material layer 120. Because up-spin electrons and down-spin electrons flow in opposite directions with each other in the pure spin-current, there is no charge transfer in the direction of the pure spin-current, but only the momentum of spin flows.

In the present specification, it is referred to as being "magnetically coupled" to be in a state in which the spin injection phenomenon can arise. The spin injection phenomenon can arise in a case where the magnetic material layer is in immediate contact with the electromotive material layer or in a case where they are so close to each other that the spin angular momentum can be transferred even if they are not in immediate contact with each other. That is to say, even though there is a void between the magnetic material layer and the electromotive material layer or an intermediate layer is inserted between them, it is considered that there is a magnetic coupling if the spin injection phenomenon can arise.

If the electromotive material layer 120 is made of a material with large spin orbit coupling, the electromotive force is generated by the inverse spin Hall effect in a direction perpendicular to the spin-current direction and the magnetization direction.

In the spin-current thermoelectric conversion element as described above, the magnitude of the electromotive force to be obtained can be calculated by multiplying the magnitude of the spin-current arising in the magnetic material layer by a spin-current injection efficiency (an injection efficiency of the spin-current at the interface with the electromotive material layer), and a spin-current/electric-current conversion efficiency (an efficiency of conversion with which the spin-current is converted into the electromotive force by the inverse spin Hall effect in the electromotive material layer). Therefore, in order to obtain a spin-current thermoelectric conversion element with larger output power, it is necessary to increase at the same time three indexes of the magnitude of the spin-current itself, the spin-current injection efficiency, and the spin-current/electric-current conversion efficiency. It is an important issue in the above in any other spintronics devices to improve the spin-current/electric-current conversion efficiency in the electromotive material layer.

The material of the electromotive material layer has both electrical conductivity and spin Hall conductivity. A dimensionless index expressing the spin Hall conductivity divided by the electric conductivity is called "a spin Hall angle". The spin Hall angle is used as an index of the magnitude of the spin Hall effect. The inverse spin Hall effect is an inverse effect to the spin Hall effect and its magnitude also depends on the spin Hall angle.

In typical experiments, Pt having a large spin Hall angle is frequently used alone as the electromotive material layer. The spin Hall angle of a similar noble metal alone such as Au, Ag, and Cu is smaller than that of Pt, but the spin-Hall angle larger than that of Pt alone may be obtained by introducing a small amount of Fe into Au as an impurity or adding Ir to Cu, for example.

CITATION LIST

Patent Literature

[PTL 1]
Japanese Unexamined Patent Application Publication No. 2009-130070
[PTL 2]
Japanese Unexamined Patent Application Publication No. 2011-249746

Non Patent Literature

[NPL 1]
Uchida et al., "Spin Seebeck insulator", Nature Materials, 2010, vol. 9, p. 894
[NPL 2]
Uchida et al., "Observation of longitudinal spin-Seebeck effect in magnetic insulators", Applied Physics Letters, 2010, vol. 97, p. 172505

SUMMARY OF INVENTION

Technical Problem

As described above, the magnitude of the electromotive force obtained in the spin-current thermoelectric conversion element depends on the spin-current/electric-current conversion efficiency due to the inverse spin Hall effect in the electromotive material layer. It is desirable to further improve the spin-current/electric-current conversion efficiency in order to enhance utility.

An object of the present invention is to provide a technique to further improve the spin-current/electric-current conversion efficiency in a spin-current thermoelectric conversion element.

Solution to Problem

In an exemplary aspect of the present invention, a thermoelectric conversion element is provided. The thermoelectric conversion element includes a magnetic material layer having in-plane magnetization; and an electromotive material layer magnetically coupled with the magnetic material layer. The electromotive material layer includes a first conductor with a spin orbit coupling arising, and a second conductor having lower electric conductivity than electric conductivity of the first conductor.

In another exemplary aspect of the present invention, a method for making a thermoelectric conversion element is provided. The method for making a thermoelectric conversion element includes a step for forming a magnetic material layer having in-plane magnetization; and a step for forming an electromotive material layer magnetically coupled with the magnetic material layer. The step for forming the electromotive material layer includes a step for forming a first conductor with a spin orbit coupling arising, and a step for forming a second conductor having lower electric conductivity than electric conductivity of the first conductor.

Advantageous Effects of Invention

According to the present invention, it becomes possible to further improve the spin-current/electric-current conversion efficiency in a spin-current thermoelectric conversion element.

DESCRIPTION OF EMBODIMENTS

A thermoelectric conversion element and a method for making the same in accordance with an exemplary embodiment of the present invention will be described with reference to accompanying drawings.

1. OVERALL CONFIGURATION

Figure 3:
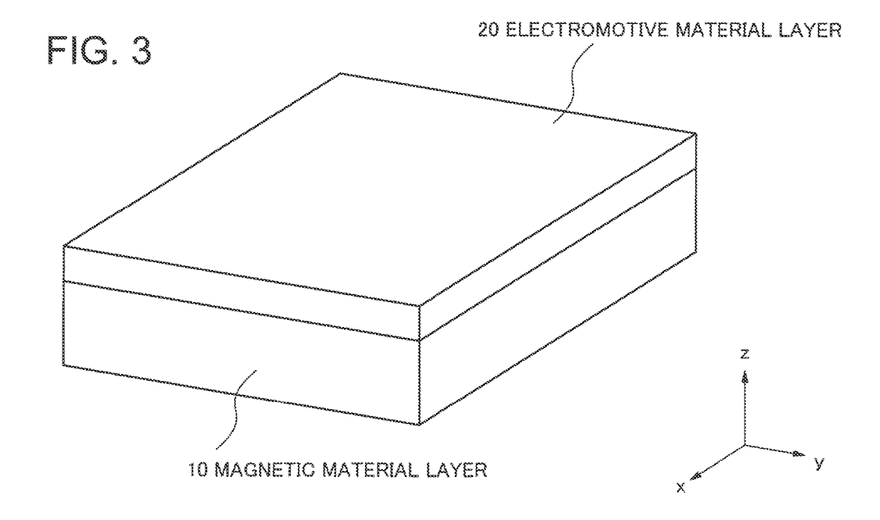
FIG. 3 is a schematic view illustrating a thermoelectric conversion element in accordance with an exemplary embodiment of the present invention.

FIG. 3 schematically illustrates a thermoelectric conversion element in accordance with the present exemplary embodiment. The thermoelectric conversion element has a stacking structure including a magnetic material layer 10 and an electromotive material layer 20. Here, the stacking direction of the magnetic material layer 10 and the electromotive material layer 20 is a z direction. The direction perpendicular to the z direction is an in-plane direction. The in-plane direction is defined by an x direction and a y direction which are normal to each other.

The magnetic material layer 10 has magnetization in at least one of in-plane directions. The magnetic material layer 10 is formed of a material with the spin Seebeck effect arising. The material of the magnetic material layer 10 can be ferromagnetic metals or magnetic insulators. The ferromagnetic metals include NiFe, CoFe, CoFeB, and the like. The magnetic insulators include yttrium iron garnet (YIG, $Y_3Fe_5O_{12}$), bismuth (Bi)-doped YIG (Bi:YIG), lanthanum (La)-added YIG ($LaY_2Fe_5O_{12}$), yttrium gallium iron garnet ($Y_3Fe_{5-x}Ga_xO_{12}$), spinel ferrite materials composed of a chemical composition of $MFe_2O_4$ (M representing a metal element including any one of Ni, Zn, and Co), and the like. It is desirable to use magnetic insulators in the light of suppressing the heat conduction due to electrons.

The electromotive material layer 20 includes a material with the inverse spin Hall effect (spin orbit coupling) arising. The electromotive material layer 20 is formed so as to be magnetically coupled with the magnetic material layer 10. In the present specification, it is referred to as "being magnetically coupled" to be in a state in which the spin injection phenomenon can arise. The spin injection phenomenon can arise in a case where the magnetic material layer 10 is in immediate contact with the electromotive material layer 20 or in a case where they are so close to each other that the spin angular momentum can be transferred even if they are not in immediate contact with each other. That is to say, even though there is a void between the magnetic material layer 10 and the electromotive material layer 20 or an intermediate layer is inserted between them, it is considered that there is a magnetic coupling if the spin injection phenomenon can arise.

If a temperature gradient in the z direction is applied to such a thermoelectric conversion element, the spin-current is induced at the interface between the magnetic material layer 10 and the electromotive material layer 20. It becomes possible to realize "the thermoelectric conversion" of generating a thermal electromotive force from a temperature gradient" by converting the spin-current into electric electromotive force by the inverse spin Hall effect in the electromotive material layer 20 and taking out the electromotive force as electric power.

2. ELECTROMOTIVE MATERIAL LAYER

The electromotive material layer 20 in the thermoelectric conversion element in accordance with the present exemplary embodiment will be described in detail below. As will become obvious later, according to the present exemplary embodiment, the electromotive material layer 20 is realized which has an excellent spin-current/electric-current conversion efficiency.

2-1. Configuration Example

Figure 4:
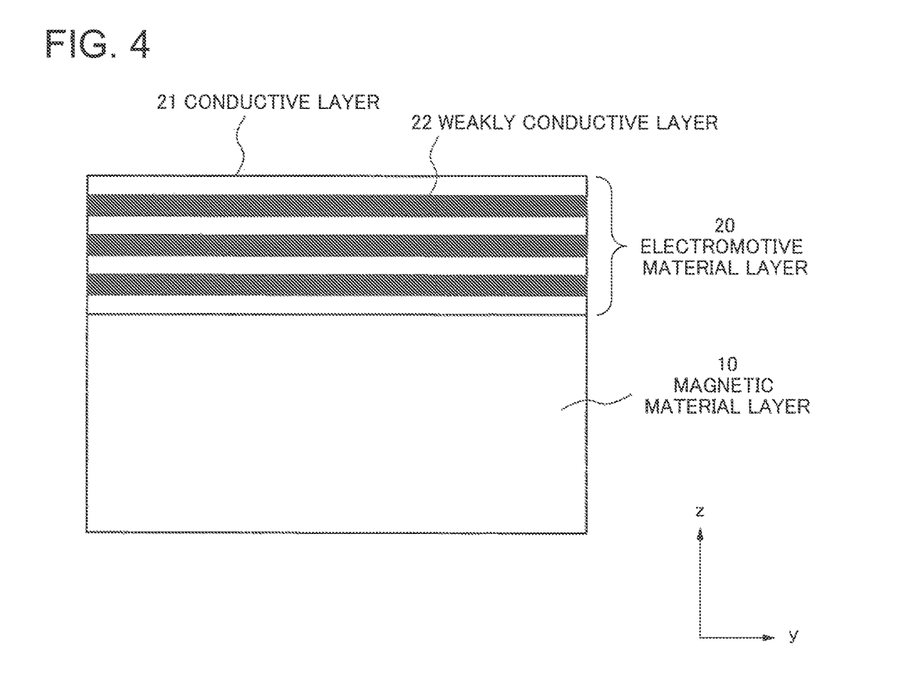
FIG. 4 is a schematic view illustrating a configuration example of an electromotive material layer in the thermoelectric conversion element in accordance with the exemplary embodiment of the present invention.

FIG. 4 is a schematic view illustrating a configuration example of the electromotive material layer 20 in accordance with the exemplary embodiment. In the example illustrated in FIG. 4, the electromotive material layer 20 includes a conductive layer 21 and a weakly conductive layer 22. In more detail, both the conductive layer 21 and the weakly conductive layer 22 have a layered structure parallel to an x-y plane, and the conductive layer 21 and the weakly conductive layer 22 are alternately stacked in the z direction. In other words, the electromotive material layer 20 has a multi-layered structure including the conductive layer 21 and the weakly conductive layer 22.

The conductive layer 21 (a first conductor) is formed out of a material with the inverse spin Hall effect (spin orbit coupling) arising. The conductive layer 21 contains a metal material having large spin orbit coupling, for example. As such a metal material, there are Au, Pt, and Pd with a relatively large spin orbit coupling, transition metals having d orbital or f orbital, or alloy materials containing above-described metals, for example. A similar effect can be obtained by only adding a material such as Fe and Ir to a general metal film material such as Cu in concentrations approximately from 0.5 to 10 mol %. If any one of W, Ta, Mo, Nb, Cr, V, and Ti in the transition metals is used, the voltage can be obtained whose sign is reverse to that using any one of Au, Pt, Pd, and alloys containing them. Alternatively, the material of the conductive layer 21 can be oxides such as ITO (indium tin oxide) or semiconductors.

The weakly conductive layer 22 (a second conductor) has lower electric conductivity than that of the conductive layer 21. The electric conductivity characterizing the weakly conductive layer 22 is concerned with electric conductivity in the direction (the z direction in many cases) parallel to the spin-current injected into the electromotive material layer 20 if the temperature gradient in the z direction is applied to the thermoelectric conversion element. The electric conductivity is relatively low compared with electric conductivity in the direction of electric current arising (in-plane direction) in the conductive layer 21. The electric conductivity described here means electric conductivity which actually appears with the inclusion of the effects of the shape in a state of having made the electromotive material layer 20, the effects of the surface and the interface, and the effects related to external fields such as electric field and magnetic field, temperature, phase transition of a material, and the like.

2-2. Operation and Effect

Figure 5:
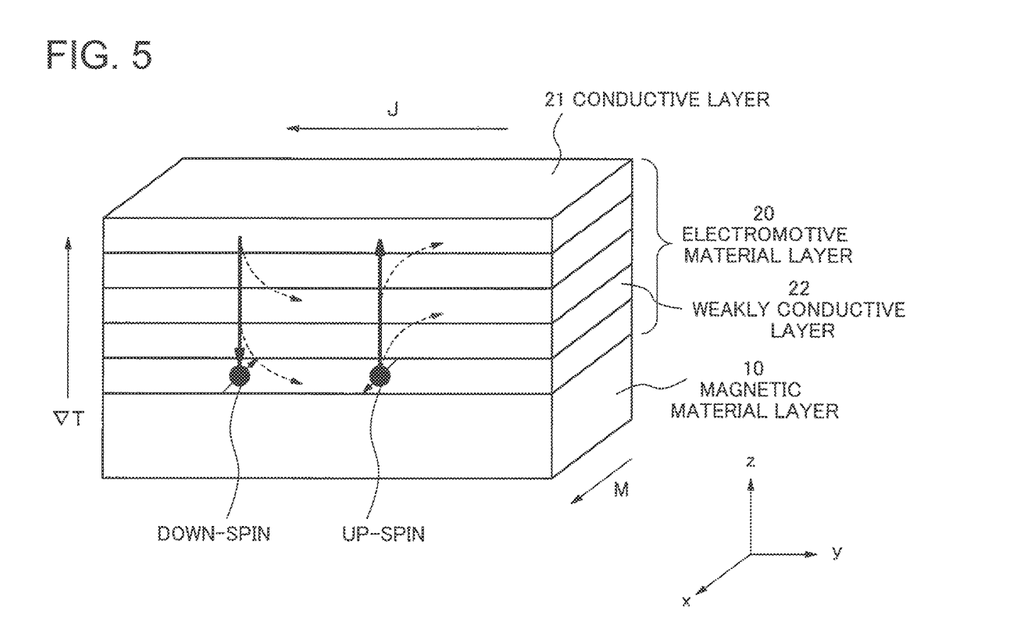
FIG. 5 is a schematic view to explain the operation of the electromotive material layer in the thermoelectric conversion element in accordance with the exemplary embodiment of the present invention.

Next, with reference to FIG. 5, thermal spin-current/ electromotive force conversion in the thermoelectric conversion element in accordance with the present exemplary embodiment will be described. In FIG. 5, the thermoelectric conversion element includes the magnetic material layer 10 having in-plane magnetization M (in x direction) and the electromotive material layer 20 disposed on the magnetic material layer 10. The electromotive material layer 20 has a multi-layered structure including the conductive layer 21 and the weakly conductive layer 22.

The temperature gradient VT in the direction from the magnetic material layer 10 to the electromotive material layer 20 is applied to the thermoelectric conversion element having such a structure. In this case, a thermal spin-current through interaction of spins is generated in the magnetic material layer 10. In addition, a spin injection arises by transferring the spin angular momentum to conduction electrons in the electromotive material layer 20 at the interface between the magnetic material layer 10 and the electromotive material layer 20, and a pure spin-current arises in the electromotive material layer 20. The pure spin-current arises so that an up-spin parallel to the magnetization M of the magnetic material layer 10 may coexist with a down-spin antiparallel to it. The up-spin electrons flow along the temperature gradient and the down-spin electrons flow against the temperature gradient.

When the spin conduction electrons moving as described above pass through the weakly conductive layer 22, the scattering probability of the spin conduction electrons increases. As a result of the scattering (a skew scattering and a side jump), the motion of the spin conduction electrons changes into a motion in a direction perpendicular to both the magnetization M and the temperature gradient, that is, a motion in the lateral direction. As a result, electric current flows in a direction perpendicular to the pure spin-current, that is to say, the inverse spin Hall effect appears. This can be referred to as "an extrinsic effect" as opposed to an intrinsic effect caused by a crystal structure, a configuration of electron orbitals, and the like.

The spin Hall conductivity arising at this time becomes a very large value reflecting large intra-layer electric conductivity of the conductive layer 21. On the other hand, the electric conductivity in the z direction of the electromotive material layer 20, by which the spin-Hall angle is defined, becomes small due to reflecting the electric conductivity caused by the scattering in the weakly conductive layer 22 and the interlayer. As a result, it becomes possible to obtain a large spin-Hall angle.

As described above, according to the present exemplary embodiment, it is possible to obtain the extrinsic spin Hall effect by providing the weakly conductive layers 22 in the electromotive material layers 20. In addition, a large spin-Hall angle is realized by an unprecedented mechanism by combining a new mechanism of the anisotropy of electric conductivity. As a result, the conversion efficiency of the material used for the spin-current/electric-current conversion increases, and then, the conversion efficiency of the spin-current thermoelectric conversion element also increases largely.

2-3. Generalization

The configuration of the electromotive material layer 20 according to the present exemplary embodiment is not limited to that illustrated in FIG. 4. In general, it is only necessary for the electromotive material layer 20 to include a first conductor with a spin orbit coupling arising and a second conductor having lower electric conductivity than that of the first conductor. This enables to obtain the above-described effect to some extent.

Preferably, the second conductor is formed so as to extend almost parallel to the interface between the magnetic material layer 10 and the electromotive material layer 20, that is, an x-y plane. This enables to obtain a large spin-Hall angle.

It is much preferable for the first conductor and the second conductor to have layered structures parallel to the x-y plane as illustrated in FIGS. 4 and 5. That is to say, it is preferable for the electromotive material layer 20 to have the stacking structure including the conductive layer 21 (the first conductor) and the weakly conductive layer 22 (the second conductor). Here, a multi-layered structure is much preferable in which more than one layer is formed each of which composes at least one of the conductive layer 21 and the weakly conductive layer 22.

The stacking structure enables a flexible device design. For example, it is possible to select particularly a material to increase the spin injection efficiency as the material of the conductive layer 21 to form the interface with the magnetic material layer 10, and select an inexpensive material having high electric conductivity as the material of the other conductive layer 21.

The thickness of each layer in the stacking structure can be optimized so that the device performance may be maximized. The thickness of each layer is not particularly limited. With regard to the minimum value of the thickness of each layer, it is also possible to use a layer with a thickness corresponding to a monoatomic layer. Further, even a layer thinner than the monoatomic layer, that is, a sub-monolayer can be regarded as a film if a two-dimensional potential without discontinuity can be composed due to a spread of the wave function of an element introduced to form a layer.

With regard to the number of stacked layers, the optimum value can be determined, taking into account the spin-current diffusion length, the electric conductivity, and the like in the electromotive material layer 20, so that the thermoelectric conversion output may be maximized.

Although the conductive layer 21 is in immediate contact with the magnetic material layer 10 in the examples illustrated in FIGS. 4 and 5, the weakly conductive layer 22 may be in immediate contact with the magnetic material layer 20.

It is also possible for a person skilled in the film formation technologies to improve the output by making all kinds of efforts, that is, making a detail of the conductive layer 21 or the weakly conductive layer 22 further multi-layered, introducing a material having non-uniform composition, and continuously depositing only the conductive layer 21 and the weakly conductive layer 22 partly.

The electromotive material layer 20 according to the present exemplary embodiment can be applied not only to the longitudinal type of thermoelectric conversion element but also to a lateral type of thermoelectric conversion element as illustrated in FIG. 1. The same effect can be also obtained by the lateral type of thermoelectric conversion element.

3. A METHOD FOR MAKING

Next, a method for making the thermoelectric conversion element in accordance with the present exemplary embodiment will be described.

Examples of the method for forming the magnetic material layer 10 include a sputtering method, a metal organic decomposition method (MOD method), a sol-gel method, an aerosol deposition method (AD method), a ferrite plating method, a liquid-phase epitaxy method, a solid-phase epitaxy method, a vapor-phase epitaxy method, a dip method, a spray method, a spin coat method, a printing method, and the like. In this case, the magnetic material layer 10 is deposited on some kind of support. Alternatively, it is possible to use as the magnetic material layer 10 a magnetic insulator fiber formed by using a crystal pulling method and the like or a bulk body formed by using a sintering method, a fusion method, and the like.

As a method for forming the conductive layer 21 and the weakly conductive layer 22, similarly, there is a deposition method using any one of a sputtering method, a vapor deposition method, a plating method, a screen printing method, an ink jet method, a spray method, a spin coat method, and the like. It is possible to use a coating and a sintering of nano-colloidal solution (see Japanese Unexamined Patent Application Publication No. 07-188934 and No. 09-20980) and the like.

4. EXAMPLES

Figure 6:
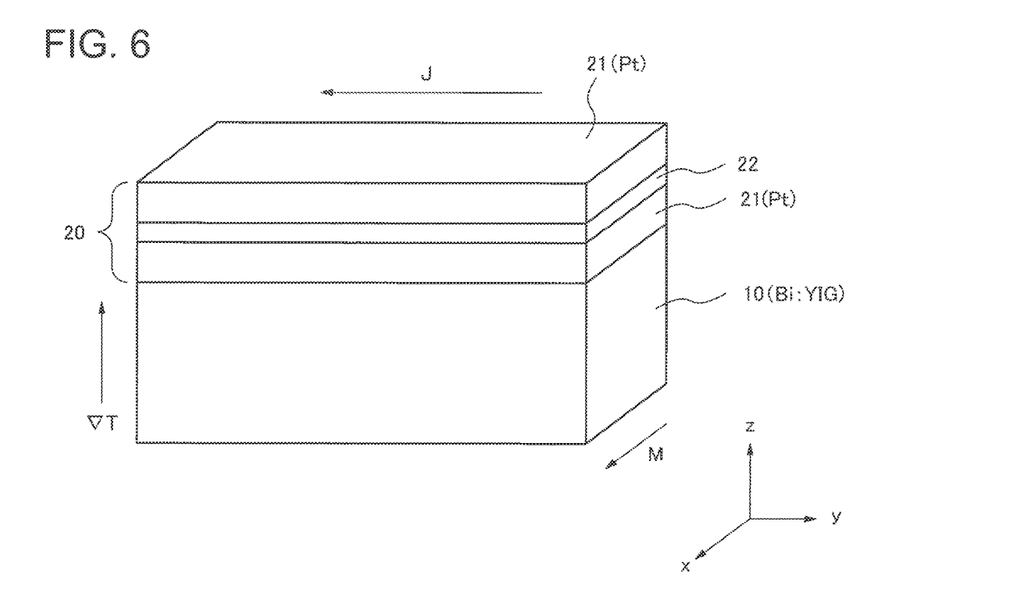
FIG. 6 is a schematic view illustrating a configuration example of the thermoelectric conversion element in accordance with the exemplary embodiment of the present invention.

With reference to FIG. 6, an example of forming a thermoelectric conversion element by the inventors of the present invention will be described. In this example, a crystalline gadolinium gallium garnet (GGG) wafer 700 μm thick was used as a substrate (not illustrated), on which a spin-current thermoelectric conversion element was formed.

Bismuth-substituted yttrium iron garnet (Bi:YIG, $BiY_2Fe_5O_{12}$) was used as the material of the magnetic material layer 10. The Bi:YIG film was formed by the metal-organic decomposition method (MOD method). The MOD solution made by Kojundo Chemical Laboratory Co., Ltd was used as a solution. In the solution, metal raw materials made at an appropriate mole fraction (Bi:Y:Fe=1: 2:5) are dissolved at a concentration of 3% in acetate ester with a carboxylated state. The solution was applied on the GGG substrate by means of a spin coating (at a rotation speed of 1000 rpm, rotating during 30 s) and dried for five minutes by a hot plate at 150° C. And then, a pre-annealing process was performed for five minutes at 500° C., and finally, a main annealing process was performed for 14 hours at high temperature of 700° C. in an air atmosphere in an electric furnace. This made the crystalline Bi:YIG film about 65 nm thick formed on the GGG substrate.

Subsequently, the electromotive material layer 20 was formed. Concretely, a Pt film 5 nm thick was evaporated by means of a sputtering as the conductive layer 21 to make contact with the magnetic material layer 10. And then, the weakly conductive layer 22 was formed on the conductive layer 21. In addition, a Pt film 5 nm thick was evaporated by means of a sputtering as the conductive layer 21 on the weakly conductive layer 22.

Example 1

As the above-described weakly conductive layer 22, a Ti thin film 1 nm thick was evaporated by means of a sputtering.

Example 2

As the weakly conductive layer 22, a W thin film 1 nm thick was evaporated by means of a sputtering.

Comparative Example 1

As comparative example 1, a sample without the weakly conductive layer 22 was formed. In this case, the electromotive material layer 20 is composed of only a Pt thin film 10 nm thick.

Figure 7A:
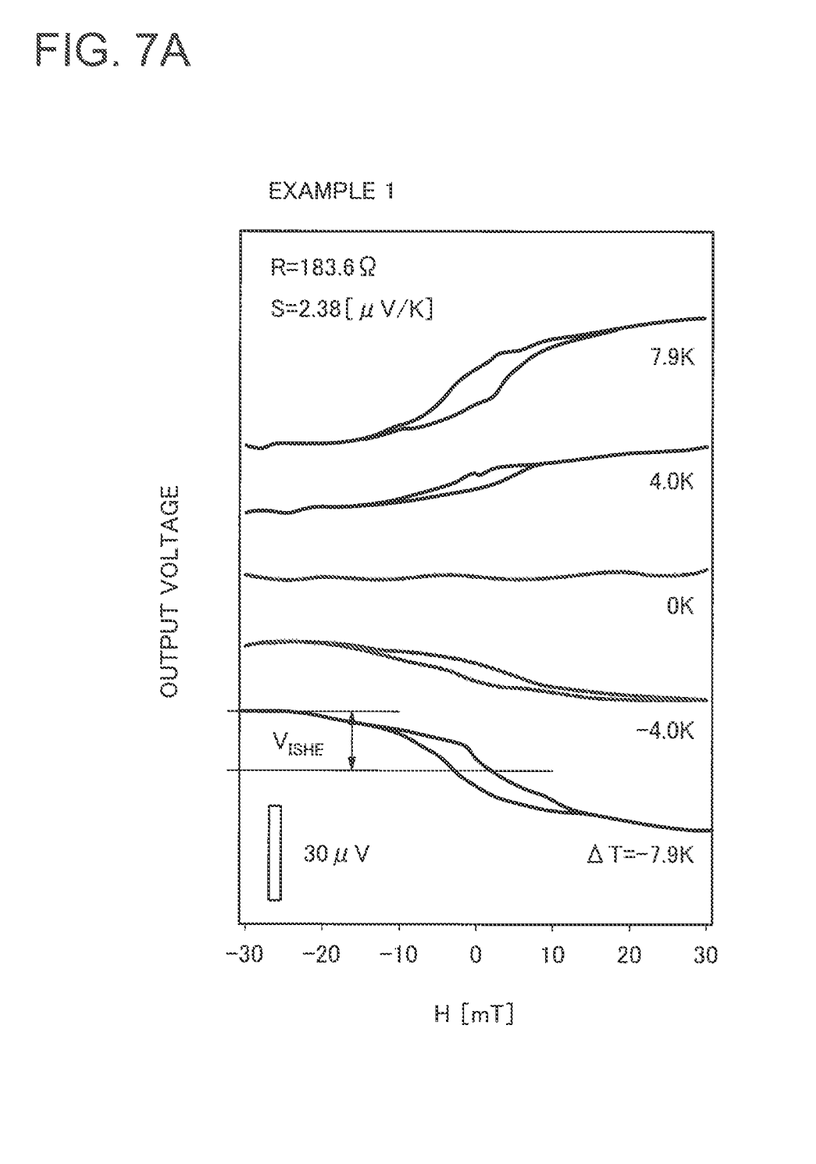
FIG. 7A is a graph illustrating output characteristics of a thermoelectric conversion element in accordance with Example 1.
Figure 7B:
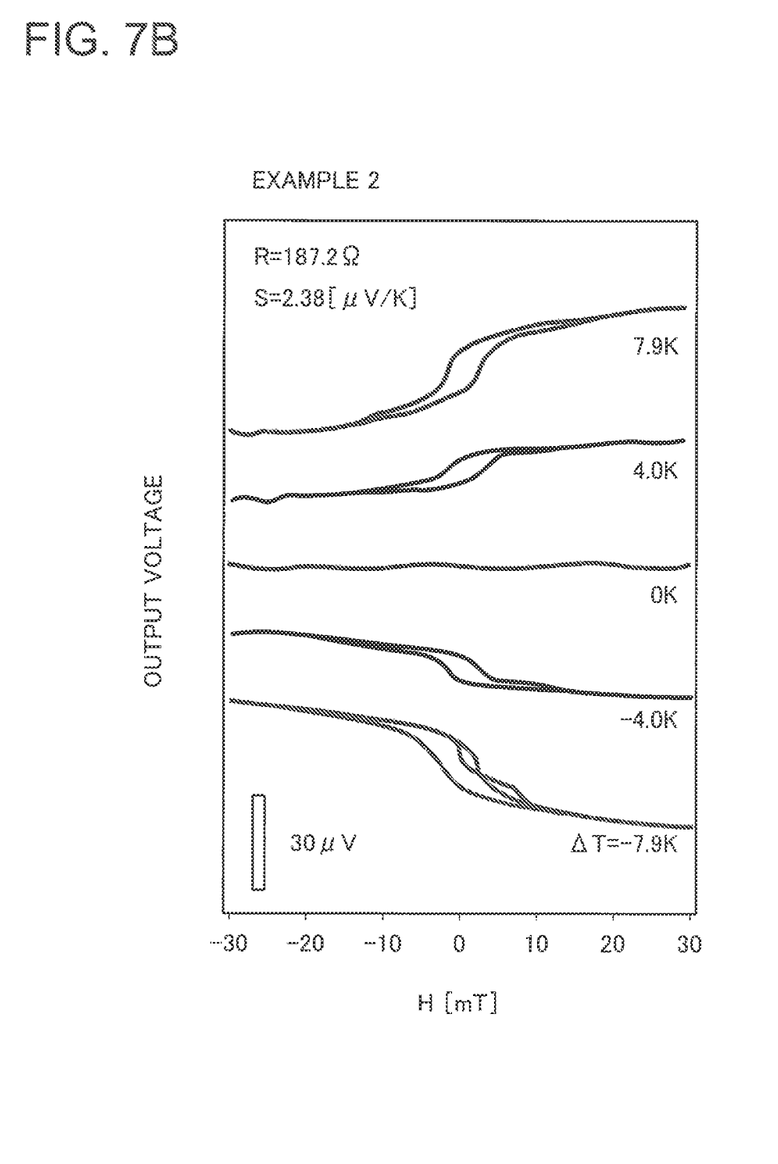
FIG. 7B is a graph illustrating output characteristics of a thermoelectric conversion element in accordance with Example 2.
Figure 7C:
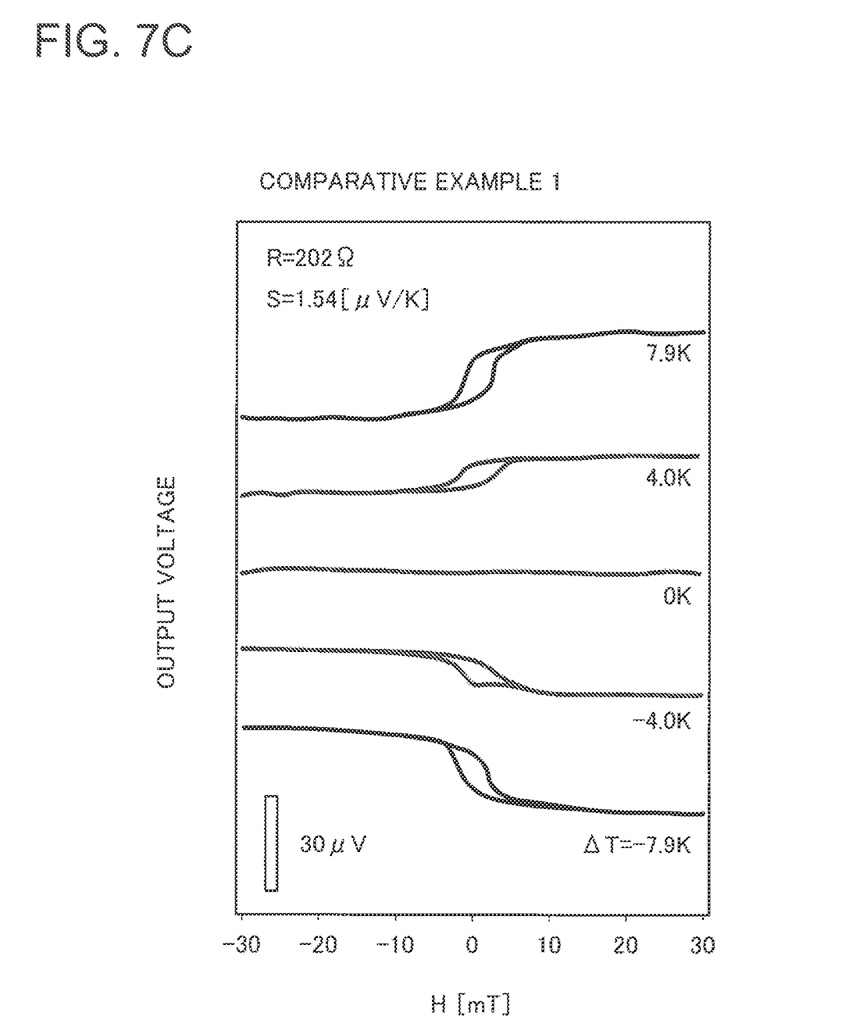
FIG. 7C is a graph illustrating output characteristics of a thermoelectric conversion element in accordance with Comparative Example 1.

With respect to each of Example 1, Example 2, and Comparative Example 1, cutting out a strip evaluation element 2 mm×8 mm in size, the thermoelectric conversion performance was measured. Concretely, spin-Seebeck signals were measured when various temperature differences were applied to each of the evaluation elements in the z direction. FIGS. 7A to 7C illustrate measurement results on Example 1, Example 2, and Comparative Example 1, respectively. In order to see whether or not signals are spin-Seebeck signals, by applying an external magnetic field, it is measured if an output voltage $V_{ISHE}$ is reversed depending on a reversal of the magnetization direction.

A spin-Seebeck constant S was estimated roughly from the value of the measured output voltage $V_{ISHE}$ and the temperature difference applied to an entire sample. As can be seen in FIGS. 7A to 7C, a larger spin-Seebeck constant S is obtained in each of Example 1 and Example 2 as compared with that in Comparative Example 1. Since the value of internal resistance R in Example 1 and Example 2 is almost the same as that in Comparative Example 1, one could argue that the larger conversion efficiency exceeding that in Comparative Example 1 has been obtained in each of Example 1 and Example 2.

Example 3

As the conductive layer 21, a Cu film 5 nm thick was evaporated by means of a sputtering instead of the above-described Pt film. As the weakly conductive layer 22, a Pt thin film 1 nm thick was evaporated by means of a sputtering.

Example 4

As the conductive layer 21, a Cu film 5 nm thick was evaporated by means of a sputtering instead of the above-described Pt film. As the weakly conductive layer 22, a W thin film 1 nm thick was evaporated by means of a sputtering.

Comparative Example 2

As comparative example 2, a sample without the weakly conductive layer 22 was formed. In this case, the electromotive material layer 20 is composed of only a Cu thin film 10 nm thick.

Figure 8:
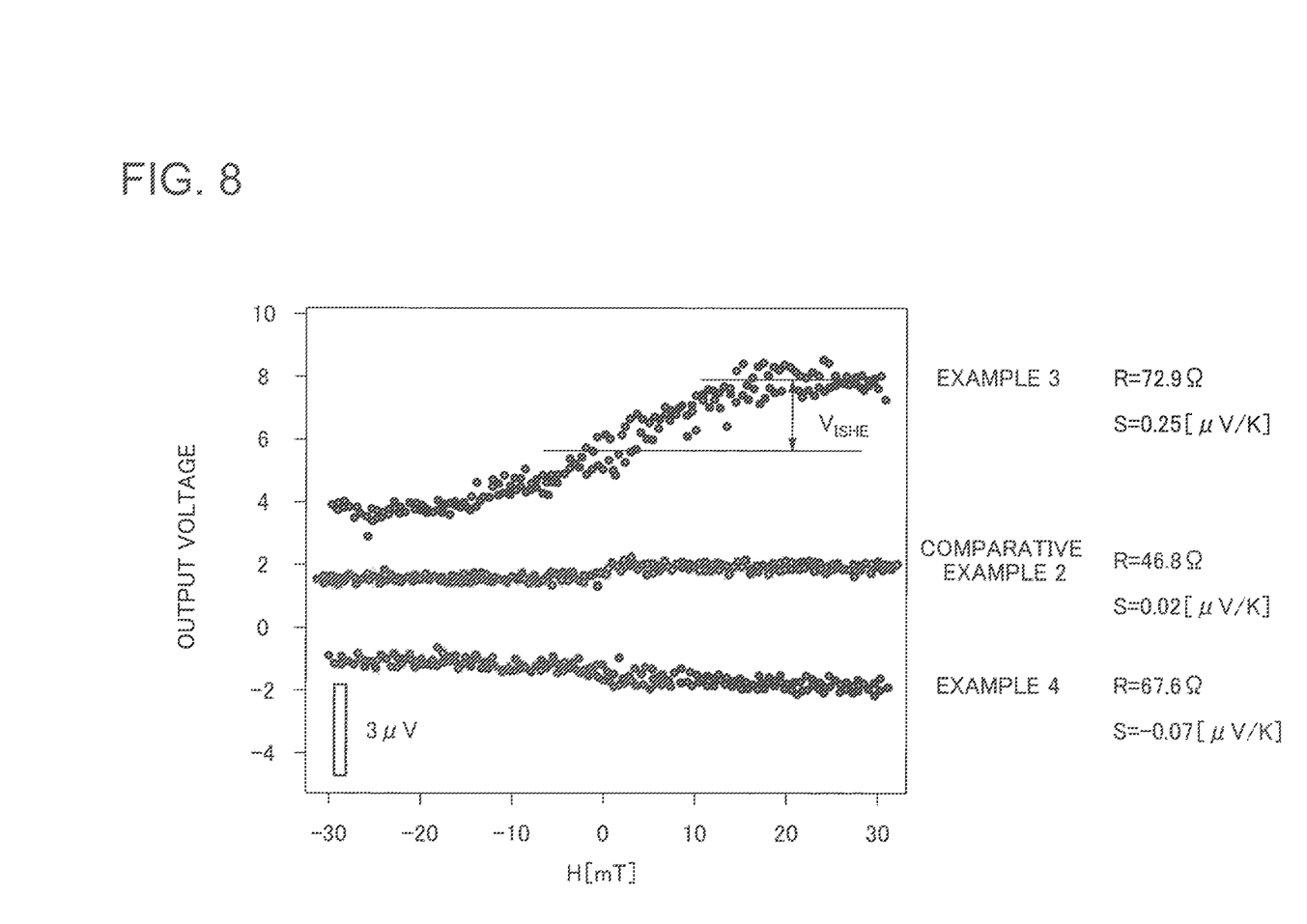
FIG. 8 is a graph illustrating output characteristics of thermoelectric conversion elements in accordance with Example 3, Example 4, and Comparative Example 2.

With respect to each of Example 3, Example 4, and Comparative Example 2, the thermoelectric conversion performance was measured as is the case with the above. FIG. 8 illustrates measurement results concerning each of Example 3, Example 4, and Comparative Example 2.

Cu is a material having a small spin-Hall angle. Therefore, a spin-Seebeck constant S with a very small positive number is observed in Comparative Example 2.

In Example 3, as a result of selecting Pt, as the weakly conductive layer, which has electric conductivity smaller than that of Cu and a spin-Hall angle larger than that of Cu, a spin-Seebeck constant S about 10 times as large as that of Comparative Example 2 can be obtained.

In Example 4, as a result of selecting W, as the weakly conductive layer, which has electric conductivity smaller than that of Cu and a spin-Hall angle with the sign opposite to that of Pt and Cu, the spin-Seebeck constant S about three times as large as that of Comparative Example 2 with the reversed sign can be obtained.

As described above, it is possible to control the spin-current/electric-current conversion function of the entire electromotive material layer 20 by combining materials having various magnitudes or different signs of the spin-Hall angle.

The exemplary embodiment of the present invention has been described above with reference to the accompanying drawings. However, the present invention is not limited to the foregoing embodiment, but various changes may be made therein by those of ordinary skill in the art without departing from the spirit and scope of the present invention.

The whole or part of the exemplary embodiments disclosed above can be described as, but not limited to, the following supplementary notes.

(Supplementary Note 1)

A thermoelectric conversion element, comprising: a magnetic material layer having in-plane magnetization; and an electromotive material layer magnetically coupled with the magnetic material layer, wherein the electromotive material layer includes a first conductor with a spin orbit coupling arising, and a second conductor having lower electric conductivity than electric conductivity of the first conductor.

(Supplementary Note 2)

The thermoelectric conversion element according to Supplementary note 1, wherein the second conductor is formed so as to extend almost parallel to an interface between the magnetic material layer and the electromotive material layer.

(Supplementary Note 3)

The thermoelectric conversion element according to Supplementary note 1 or 2, wherein the first conductor and the second conductor have layered structures.

(Supplementary Note 4)

The thermoelectric conversion element according to the Supplementary note 3, wherein more than one layer is formed each of which composes at least one of the first conductor and the second conductor.

(Supplementary Note 5)

A method for making a thermoelectric conversion element, comprising: a step for forming a magnetic material layer having in-plane magnetization; and a step for forming an electromotive material layer magnetically coupled with the magnetic material layer, wherein the step for forming the electromotive material layer includes a step for forming a first conductor with a spin orbit coupling arising, and a step for forming a second conductor having lower electric conductivity than electric conductivity of the first conductor.

This application is based upon and claims the benefit of priority from Japanese Patent Application No. 2013-011338, filed on Jan. 24, 2013, and the disclosure of which is incorporated herein in its entirety by reference.

REFERENCE SIGNS LIST

10 Magnetic material layer
20 Electromotive material layer
21 Conductive layer
22 Weakly conductive layer

The invention claimed is:

1. A thermoelectric conversion element, comprising:
a magnetic material layer having in-plane magnetization; and
an electromotive material layer magnetically coupled with the magnetic material layer and stacked on the magnetic material layer,
wherein
the magnetic material layer is a magnetic insulator,
the electromotive material layer includes
a first conductor with a spin orbit coupling arising, and
a second conductor having lower electric conductivity than the electric conductivity of the first conductor,
the magnetic material layer is magnetically coupled with one of the first conductor and the second conductor,
the electromotive material layer has one multi-layered structure in which the first conductor and the second conductor are stacked alternately in a stacking direction of the magnetic material layer and the electromotive material layer,
the one multi-layered structure includes more than one layer of at least one of the first conductor and the second conductor, and
the stacking direction is perpendicular to the electromotive material layer.

2. The thermoelectric conversion element according to claim 1,
wherein the second conductor is formed so as to extend almost parallel to an interface between the magnetic material layer and the electromotive material layer.

3. A method for making a thermoelectric conversion element, comprising:
forming a magnetic material layer having in-plane magnetization, the magnetic material layer being a magnetic insulator; and
stacking an electromotive material layer on the magnetic material layer at one site, the electromotive material layer magnetically coupled with the magnetic material layer,
wherein the forming the electromotive material layer includes
stacking, in a stacking direction of the magnetic material layer and the electromotive material layer, a first conductor with a spin orbit coupling arising and a second conductor having lower electric conductivity than the electric conductivity of the first conductor,
magnetically coupling one of the first conductor and the second conductor with the magnetic material layer, and
forming more than one layer of at least one of the first conductor and the second conductor, and
the stacking direction is perpendicular to the electromotive material layer.

4. The thermoelectric conversion element according to claim 1,
wherein the magnetic insulator is magnetically coupled with the one multi-layered structure on a single face.

* * * * *